United States Patent
Xu

(10) Patent No.: US 11,200,840 B2
(45) Date of Patent: Dec. 14, 2021

(54) DISPLAY PANEL, MANUFACTURING METHOD THEREOF, MAINTENANCE METHOD THEREOF AND DISPLAY DEVICE

(71) Applicant: BOE TECHNOLOGY GROUP CO., LTD., Beijing (CN)

(72) Inventor: Pan Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 33 days.

(21) Appl. No.: 16/097,051

(22) PCT Filed: Jan. 25, 2018

(86) PCT No.: PCT/CN2018/074100
§ 371 (c)(1),
(2) Date: Oct. 26, 2018

(87) PCT Pub. No.: WO2019/000930
PCT Pub. Date: Jan. 3, 2019

(65) Prior Publication Data
US 2019/0156740 A1 May 23, 2019

(30) Foreign Application Priority Data
Jun. 27, 2017 (CN) .......................... 201710501707.4

(51) Int. Cl.
*G09G 3/3233* (2016.01)
*H01L 27/32* (2006.01)
(Continued)

(52) U.S. Cl.
CPC ....... *G09G 3/3233* (2013.01); *H01L 27/3213* (2013.01); *H01L 27/3216* (2013.01);
(Continued)

(58) Field of Classification Search
CPC ............. G09G 3/3233; G09G 2330/08; G09G 2330/12; G09G 2330/10
See application file for complete search history.

(56) References Cited

U.S. PATENT DOCUMENTS

2004/0233140 A1* 11/2004 Jo ........................ H01L 27/3244
345/76
2006/0186822 A1* 8/2006 Park ..................... G09G 3/3233
315/169.3
(Continued)

FOREIGN PATENT DOCUMENTS

| CN | 1523552 A | 8/2004 |
|---|---|---|
| CN | 102437112 A | 5/2012 |

(Continued)

OTHER PUBLICATIONS

International Search Report of PCT/CN2018/074100 in Chinese, dated Apr. 18, 2018 with English translation.
(Continued)

*Primary Examiner* — Yuzhen Shen
(74) *Attorney, Agent, or Firm* — Collard & Roe, P.C.

(57) ABSTRACT

Embodiments of the present disclosure relate to an organic light emitting diode display panel, a manufacturing method thereof, a maintenance method and a display device. The organic light emitting diode display panel includes a base substrate and a plurality of subpixel units disposed on the base substrate, wherein each of the subpixel units includes a driving circuit and at least two light emitting regions; in each of the subpixel units, a same output terminal of the driving circuit is split into at least two sub output terminals; and the at least two light emitting regions are respectively connected with different sub output terminals.

14 Claims, 6 Drawing Sheets

(51) Int. Cl.
*H01L 51/52* (2006.01)
*H01L 51/56* (2006.01)

(52) U.S. Cl.
CPC ...... *H01L 27/3218* (2013.01); *H01L 27/3246* (2013.01); *H01L 27/3276* (2013.01); *H01L 51/5206* (2013.01); *H01L 51/5221* (2013.01); *H01L 51/56* (2013.01); *G09G 2300/0426* (2013.01); *G09G 2300/0452* (2013.01); *G09G 2320/0233* (2013.01); *G09G 2320/0626* (2013.01); *G09G 2330/10* (2013.01)

(56) References Cited

U.S. PATENT DOCUMENTS

| | | | |
|---|---|---|---|
| 2013/0256723 A1 | 10/2013 | Jin et al. | |
| 2015/0144925 A1* | 5/2015 | Baek | H01L 27/3213 257/40 |
| 2015/0187272 A1* | 7/2015 | Kimura | G09G 3/3233 345/694 |
| 2017/0125496 A1* | 5/2017 | Oh | H01L 51/5265 |
| 2017/0193898 A1* | 7/2017 | Lee | H01L 27/3258 |
| 2017/0373122 A1* | 12/2017 | Chen | H01L 33/20 |

FOREIGN PATENT DOCUMENTS

| | | |
|---|---|---|
| CN | 102983283 A | 3/2013 |
| CN | 107248391 A | 10/2017 |
| CN | 107507926 A | 12/2017 |
| GN | 100412916 C | 8/2008 |

OTHER PUBLICATIONS

Notice of Transmittal of the International Search Report of PCT/CN2018/074100 in Chinese, dated Apr. 18, 2018.

Written Opinion of the International Searching Authority of PCT/CN2018/074100 in Chinese, dated Apr. 18, 2018 with English translation.

Chinese Office Action in Chinese Application No. 201710501707.4, dated Apr. 23, 2019 with English translation.

* cited by examiner

DISPLAY PANEL, MANUFACTURING METHOD THEREOF, MAINTENANCE METHOD THEREOF AND DISPLAY DEVICE

CROSS REFERENCE TO RELATED APPLICATIONS

This application is the National Stage of PCT/CN2018/074100 filed on Jan. 25, 2018, which claims priority under 35 U.S.C. § 119 of Chinese Application No. 201710501707.4 filed on Jun. 27, 2017, the disclosure of which is incorporated by reference.

TECHNICAL FIELD

At least one embodiment of the present disclosure relates to an organic light emitting diode (OLED) display panel, a manufacturing method of the organic light emitting diode display panel, a maintenance method of the organic light emitting diode display panel, and a display device.

BACKGROUND

Organic light emitting diode (OLED) display device is a new type flat panel display device and is a self-luminous device having a series of advantages such as all-solid state structure, high brightness, full viewing angle, rapid response and flexible display. Therefore, organic light emitting diode display device has currently become the next-generation display technology having competitiveness and development prospect.

At present, in the manufacturing process of the organic light emitting diode display device, yield is one of the main problems that affect the production cost. Upon some defective spots appearing, the defective spots (pixels) will directly lead to the failure of the entire display device. The manufacturing process of general organic light emitting diode display devices is carried out in a vacuum environment, so the cleanliness of the environment is one of the main reasons that affect the yield. For example, residual impurities in the manufacturing process will easily cause partial short circuit between anodes and cathodes and then result in dark spot defect, thus reducing the reliability of the organic light emitting diode display device.

SUMMARY

At least one embodiment of the present disclosure provides an organic light emitting diode display panel, a manufacturing method thereof, a maintenance method thereof, and a display device. Upon any one of the light emitting regions in a subpixel unit included by the organic light emitting display panel being defective, by cutting the sub output terminal connected with the abnormal light emitting region, the brightness of image light emitted by the abnormal subpixel unit including the abnormal light emitting region basically remain unchanged.

At least one embodiment of the present disclosure provides an organic light emitting diode display panel, including: a base substrate; and a plurality of subpixel units, located on the base substrate, each of the subpixel units includes a driving circuit and at least two light emitting regions; in each of the subpixel units, a same output terminal of the driving circuit is split into at least two sub output terminals; and the at least two light emitting regions are respectively connected with different ones of the at least two sub output terminals, so that different ones of the at least two light emitting regions can emit same image light under a control of a same image display signal.

For example, the at least two light emitting regions in each of the subpixel units have an equal area.

For example, the at least two light emitting regions in each subpixel unit include two light emitting regions.

For example, the two light emitting regions in each of the subpixel units are respectively disposed on two opposite sides of the driving circuit.

For example, the at least two light emitting regions in each of the subpixel units include at least three light emitting regions; and the at least three light emitting regions are arranged around the driving circuit.

For example, each of the at least two light emitting regions includes a first electrode, a light emitting layer and a second electrode; and the first electrode is connected with a corresponding one of the sub output terminals.

For example, wherein the plurality of subpixel units include subpixel units of different colors.

At least one embodiment of the present disclosure provides a manufacturing method of an organic light emitting diode display panel, including: providing a base substrate; and forming a plurality of subpixel units on the base substrate, forming each of the subpixel units includes: forming a driving circuit and at least two light emitting regions; in each of the subpixel units, a same output terminal of the driving circuit is split into at least two sub output terminals; and the at least two light emitting regions are respectively connected with different ones of the sub output terminals, so that different light emitting regions can emit same image light under a control of a same image display signal.

For example, the at least two light emitting regions in each of the subpixel units have an equal area.

For example, forming the at least two light emitting regions includes: forming a first electrode, a light emitting layer and a second electrode; and the first electrode is connected with a corresponding one of the sub output terminals.

At least one embodiment of the present disclosure provides a display device, including the organic light emitting diode display panel according to any one of the abovementioned examples.

At least one embodiment of the present disclosure provides a maintenance method of the organic light emitting diode display panel according to any one of the abovementioned examples, including: cutting a connection between an abnormal one of the at least two light emitting regions and a corresponding one of the sub output terminals in an abnormal one of the subpixel units.

For example, the cutting a connection between an abnormal one of the at least two light emitting regions and a corresponding one of the sub output terminals in an abnormal one of the subpixel units includes: using a laser cutting method to cut the connection between the abnormal one of the at least two light emitting regions and the corresponding one of the sub output terminals in the abnormal one of the subpixel units.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "On," "under," and the like are only used to indicate relative position relationship, and when the position of the object which is described is changed, the relative position relationship may be changed accordingly.

Figure 1:
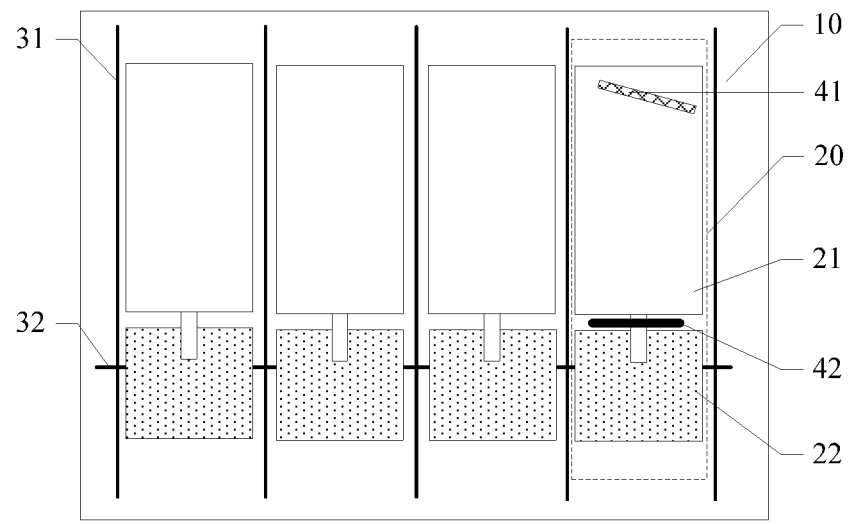
FIG. 1 is a schematic partial view of an organic light emitting diode display panel.

FIG. 1 is a schematic partial view of an organic light emitting diode display panel. As illustrated in FIG. 1, the organic light emitting diode display panel comprises a base substrate 10 and a plurality of subpixel units 20, a plurality of data lines 31 and a plurality of scanning lines 32 disposed on the base substrate 10. Each subpixel unit 20 includes a driving circuit 22 and a light emitting region 21. The data line 31 of the organic light emitting diode display panel is connected with an anode of an organic light emitting diode unit in the light emitting region 21 through the driving circuit 22, so as to transmit a display signal to the organic light emitting diode unit in the light emitting region 21.

The inventor(s) of the present application has noted in study that: in the manufacturing processes of the organic light emitting diode display panel, particles (impurities) will cause short circuit between anodes and cathodes of organic light emitting diode units, or some other factors will cause the breakdown of the organic light emitting diode units and then result in the generation of defective spots (pixels). Upon the number of the defective spots being increased over a specified quantity, the entire display panel will have poor condition, and then the reliability of the organic light emitting diode units is reduced. As for a large-size organic light emitting diode display device, the impact of the defective spots on the yield is particularly obvious.

A dark spot of a pixel caused by the short circuit of the organic light emitting diode unit is usually maintained by cutting off a power supply line (an anode line) of the pixel by laser, so as to ensure that no current flows towards the cathode and prevent the deterioration of the organic light emitting diode unit. As shown in FIG. 1, there is a short circuit 41 (or other defective pixel defects) in the light emitting region 21 of the subpixel unit 20, and the method of cutting the connection between the light emitting region 21 and the driving circuit 22 by laser is adopted to ensure that no current flows towards the cathode, namely a laser cutting position 42 is disposed between the light emitting region 21 and the driving circuit 22, so as to ensure that no current flows towards the cathode, so as to prevent deterioration. In a case there is a defective spot in the subpixel units of the organic light emitting diode unit, after the connection between the light emitting region having the defective spot and the driving circuit is cut, the abnormal subpixel unit will not emit light, resulting in a pixel defect.

Embodiments of the present disclosure provide an organic light emitting diode display panel, a manufacturing method thereof, a maintenance method thereof and a display device. The organic light emitting diode display panel comprises a base substrate and a plurality of subpixel units disposed on the base substrate, wherein each subpixel unit includes a driving circuit and at least two light emitting regions; in each subpixel unit, a same output terminal of the driving circuit is split into at least two sub output terminals; and different ones of the light emitting regions are connected with different ones of the sub output terminals, so that different light emitting regions can emit same image light under a control of a same image display signal. In a case where there is a defective spot in any one of the at least two light emitting regions of the subpixel unit of the organic light emitting diode display panel, the abnormal subpixel unit including the abnormal light emitting region can be maintained by cutting the connection between the abnormal light emitting region and the corresponding sub output terminal. Because the at least two light emitting regions in the subpixel unit are in parallel connection, upon the abnormal light emitting region and the driving circuit being disconnected, the current flowing on other normal light emitting regions is larger, so the luminous brightness of other normal light emitting regions can be increased. Therefore, the brightness of the image light, emitted by the abnormal subpixel unit including the abnormal light emitting region, basically remains unchanged.

Hereafter, the organic light emitting diode display panel, the manufacturing method thereof, the maintenance method thereof and the display device, provided by the embodiment of the present disclosure, will be described with reference to the accompanying drawings.

Figure 2A:
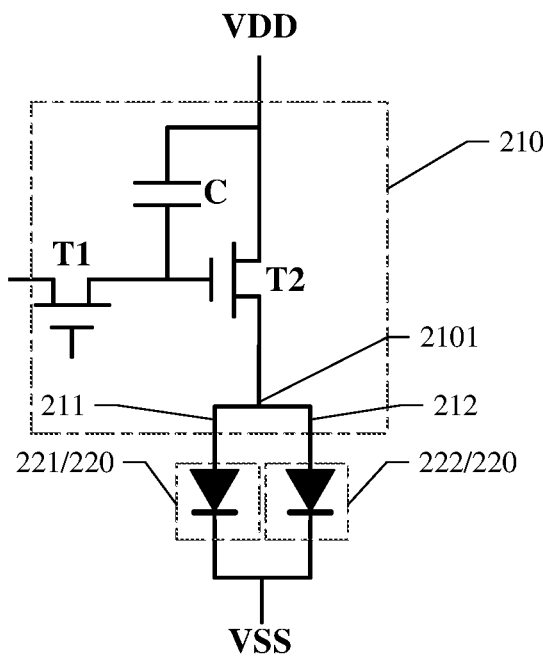
FIG. 2A is a schematic diagram of an equivalent circuit of one subpixel unit of an organic light emitting diode display panel provided by one example of one embodiment of the present disclosure.
Figure 2B:
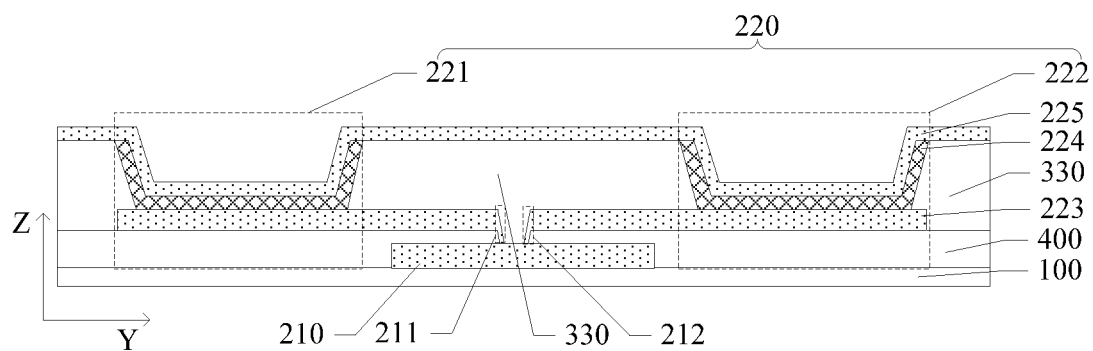
FIG. 2B is a partial sectional view of the organic light emitting diode display panel having the equivalent circuit as shown in FIG. 2A.
Figure 2C:
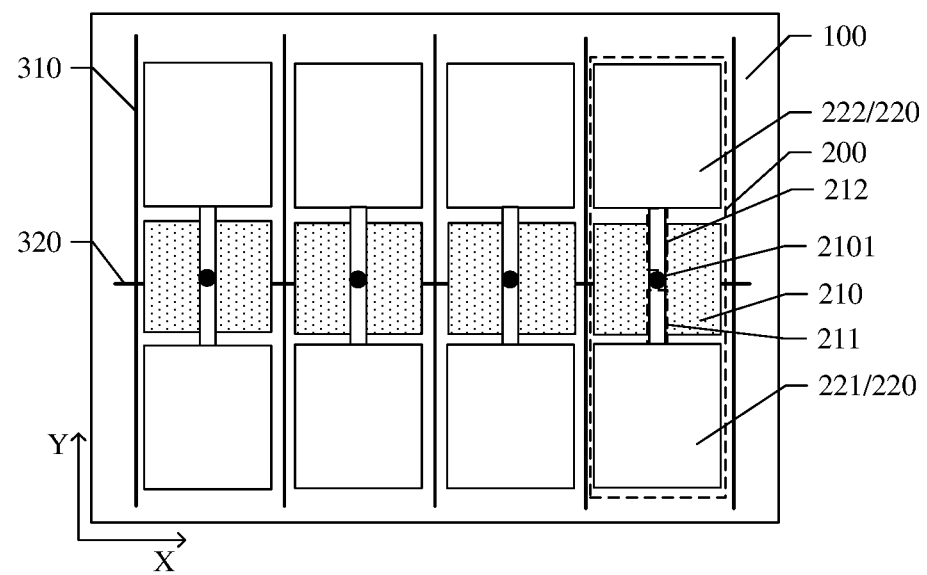
FIG. 2C is a schematic partial plan view of the organic light emitting diode display panel having the equivalent circuit as shown in FIG. 2A.

An embodiment of the present disclosure provides an organic light emitting diode display panel. FIG. 2A is a schematic diagram of an equivalent circuit of one subpixel unit in an organic light emitting diode display panel provided by one example of the embodiment. FIG. 2B is a partial sectional view of the organic light emitting diode display panel having the equivalent circuit as shown in FIG. 2A. FIG. 2C is a schematic partial plan view of the organic light emitting diode display panel having the equivalent circuit as shown in FIG. 2A. As shown in FIGS. 2A to 2C, the organic light emitting diode display panel includes a base substrate 100 and a plurality of subpixel units 200, a plurality of data lines 310 and a plurality of scanning lines 320 which are located on the base substrate 100. Each of the subpixel units 200 includes a driving circuit 210 and at least two light emitting regions 220. In each subpixel unit 200, the same output terminal 2101 of the driving circuit 210 is split into at least two sub output terminals. Different ones of the light emitting regions 220 are connected with different ones of the sub output terminals, so that the light emitting regions 220 can emit the same image light under the control of the same image display signal.

It should be noted that the circuit structure of the driving circuit 210 in FIG. 2A is only illustrative. For example, the driving circuit 210 can be a 2T1C structure, namely including a first thin-film transistor (TFT), a second TFT and a storage capacitor. The embodiment includes but is not limited thereto. For example, the driving circuit 210 can also be a 4T2C or 4T1C structure.

Because the volume of the particles (the impurities) causing the short circuit of the organic light emitting diode display panel is relatively small, in a case where the subpixel unit 200 in the embodiment includes at least two light emitting regions 220, upon there being a defective spot in any one of the light emitting regions 220, the brightness of the image light, emitted by the abnormal subpixel unit 200 including the abnormal light emitting region 220, remains basically the same by cutting the connection between the abnormal light emitting region 220 and corresponding sub output terminal. Compared with the case that the subpixel unit only includes one light emitting region, the subpixel unit 200 in the embodiment including at least two light emitting regions 220, because the at least two light emitting regions 220 in the subpixel unit 200 are in parallel connection, upon there being a defective spot in any one of light emitting regions 220, after the connection between the abnormal light emitting region 220 and the sub output terminal is cut, the current density of other normal light emitting regions 220 in the abnormal subpixel unit 200 including the abnormal light emitting region 220 is increased, so the brightness is increased. Therefore, the brightness density of the entire abnormal subpixel unit 200 is basically unchanged, and the visual brightness of the abnormal subpixel unit 200 is basically unchanged. It should be noted that "cutting the connection between the abnormal light emitting region 220 and the sub output terminal" refers to that the abnormal light emitting region and the sub output terminal are not electrically connected by the method of cutting a connecting line between the abnormal light emitting region 220 and the sub output terminal. The connecting line may be one part of an electrode of the abnormal light emitting region 220 and may also be one part of the sub output terminal. No limitation will be given here in the embodiment.

It should be noted that FIGS. 2A-2C illustratively show the example that each subpixel unit 200 includes two light emitting regions 220, namely a first light emitting region 221 and a second light emitting region 222.

For example, as shown in FIGS. 2A-2C, the organic light emitting diode display panel provided by the embodiment includes the first light emitting region 221, the second light emitting region 222, and a pixel define layer (PDL) 330 disposed between the two light emitting regions.

For example, the organic light emitting diode display panel further includes a driving circuit 210 disposed on the base substrate 100, and an insulating layer 400 for covering the driving circuit 210.

For example, the first light emitting region 221 includes a first electrode 223, an light emitting layer 224 and a second electrode 225; the first electrode 223 is connected with the first sub output terminal 211 split from the output terminal 2101 of the driving circuit 210; the second light emitting region 222 includes a first electrode 223, an light emitting layer 224 and a second electrode 225; and the first electrode 223 is connected with the second sub output terminal 212 split from the output terminal 2101 of the driving circuit 210. A black dot between the first sub output terminal 211 and the second output terminal 212 in FIG. 2C is referred to that the first sub output terminal 211 and the second sub output terminal 212 are connected to the same output terminal 2101 of the driving circuit 210. Because a data line (or a power supply line) of the organic light emitting diode display panel transmits a display signal to the light emitting region 220 by being connected with the first electrode 223 in the light emitting region 220 through the driving circuit 210, the first light emitting region 221 and the second light emitting region 222 emit the same image light under the control of the same image display signal.

For example, the first electrode 223 in the embodiment can be an anode. The anode serves as a positive voltage connecting electrode of the organic light emitting diode display panel and has good conductivity and high work function value. The embodiment includes but is not limited thereto.

For example, the second electrode 225 in the embodiment may be a cathode. The cathode serves as a negative voltage connecting electrode of the organic light emitting diode display panel and has good conductivity and low work function value. The embodiment includes but is not limited thereto.

For example, as shown in FIGS. 2A-2C, the second electrodes 225 of the first light emitting region 221 and the second light emitting region 222 can be a common cathode layer. The embodiment includes but is not limited thereto.

It should be noted that: FIGS. 2A-2C illustratively show the case that the light emitting layer 224 is disposed between the first electrode 223 and the second electrode 225, but actually, a functional layer, including at least one of a hole transport layer (HTL), an electron transport layer (ETL), a hole injection layer (HIL), an electron injection layer (EIL), a hole blocking layer (HBL) or an electron blocking layer (EBL), is also disposed between the first electrode 223 and the second electrode 225.

It should be noted that: in the embodiment, the first sub output terminal 211 and the second sub output terminal 212, respectively connected with the first light emitting region 221 and the second light emitting region 222, may be the first electrodes 223 on the outside of the light emitting regions 220, namely parts of the first electrodes 223, disposed on the outside of the light emitting regions 220, in the first light emitting region 221 and the second light emitting region 222 can be respectively regarded as the first sub output terminal 211 and the second sub output terminal 212. The embodiment includes but is not limited thereto.

For example, the first sub output terminal 211 and the second sub output terminal 212 can also be independently manufactured and configured to connect the light emitting regions and the driving circuit. FIG. 2B only illustratively shows the connection relationship between the light emitting region and the driving circuit.

For example, the driving circuit 210 in each subpixel unit 200 includes TFTs (not shown in the figure) connected with the first sub output terminal 211 and the second sub output terminal 212. Both the first sub output terminal 211 and the second sub output terminal 212 shown in FIG. 2B are connected to drain electrodes of the TFTs. Therefore, the drain electrodes of the TFTs can be regarded as the output terminal of the driving circuit. The embodiment includes but is not limited thereto.

For example, as shown in FIG. 2C, the light emitting regions 220 in each subpixel unit 200 have an equal area. For example, the the first light emitting region 221 and the second light emitting region 222 shown in the figure have an equal area. Therefore, in the case that the pixel unit 200 normally emits light, each light emitting region 220 has the same equivalent impedance and current density and synchronous aging.

For example, as shown in FIG. 2C, each subpixel unit 200 includes two light emitting regions 220, namely each subpixel unit 200 includes the first light emitting region 221 and the second light emitting region 222.

For example, as shown in FIG. 2C, the two light emitting regions 220 in each subpixel unit 200 are respectively disposed on two opposite sides of the driving circuit 210, namely the first light emitting region 221 and the second light emitting region 222 are respectively disposed on two sides of the driving circuit 210 along the Y direction. The embodiment includes but is not limited thereto.

For example, the plurality of subpixel units include subpixel units 200 of different colors.

For example, the subpixel units 200 of different colors can include a red subpixel unit, a green subpixel unit, a blue subpixel unit and a white subpixel unit. The embodiment includes but is not limited thereto.

Figure 3A:
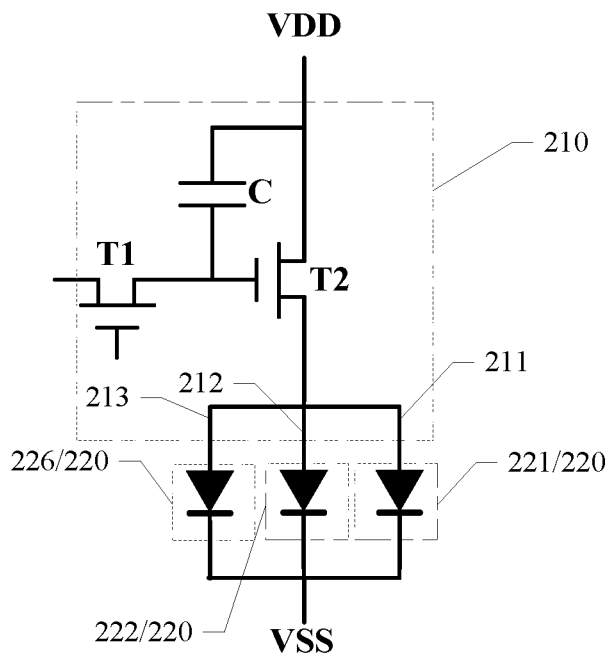
FIG. 3A is a schematic diagram of an equivalent circuit of one subpixel unit of an organic light emitting diode display panel provided by another example of one embodiment of the present disclosure.
Figure 3B:
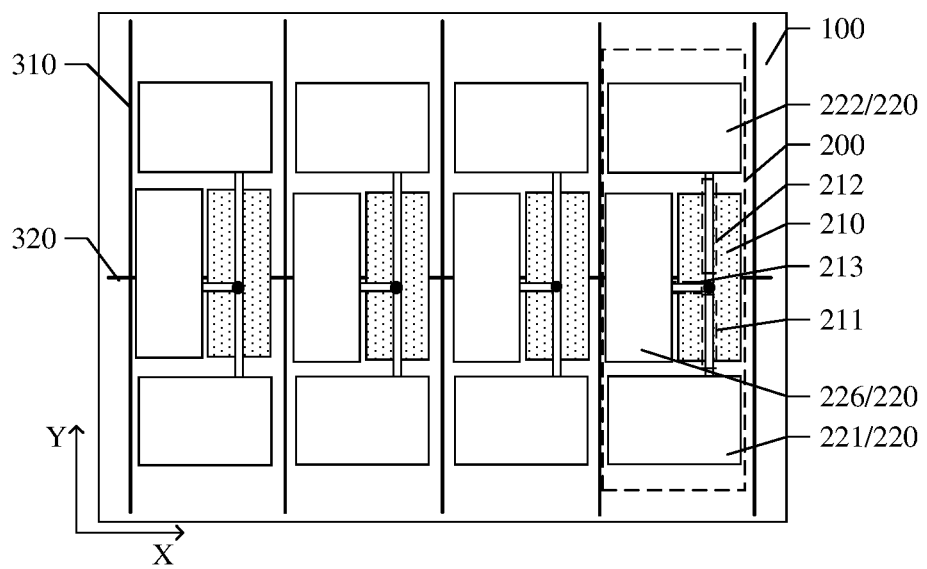
FIG. 3B is a schematic partial plan view of the organic light emitting diode display panel having the equivalent circuit as shown in FIG. 3A.

For example, FIG. 3A is a schematic diagram of an equivalent circuit of one subpixel unit of an organic light emitting diode display panel provided by another example of the embodiment, and FIG. 3B is a schematic partial plan view of the organic light emitting diode display panel having the equivalent circuit as shown in FIG. 3A. As shown in FIGS. 3A-3B, each subpixel unit 200 includes three light emitting regions 220, namely a first light emitting region 221, a second light emitting region 222 and a third light emitting region 226. For example, the first light emitting region 221 is connected with a first sub output terminal 211 split from the driving circuit 210; the second light emitting region 222 is connected with a second sub output terminal 212 split from the driving circuit 210; and the third light emitting region 226 is connected with a third sub output terminal 213 split from the driving circuit 210. Because a data line (or a power supply line) of the organic light emitting diode display panel transmits a display signal to the light emitting region 220 by being connected with the light emitting region 220 through the driving circuit 210, the first light emitting region 221, the second light emitting region 222 and the third light emitting region 226 emit the same image light under the control of the same image display signal.

For example, the driving circuit 210 in each subpixel unit 200 includes TFTs (not shown in the figure) connected with the first sub output terminal 211, the second sub output terminal 212 and the third output terminal 213. The first sub output terminal 211, the second sub output terminal 212 and the third output terminal 213 are all connected to drain electrodes of the TFTs. Therefore, the drain electrodes of the TFTs may be regarded as the output terminal of the driving circuit. The embodiment includes but is not limited thereto.

For example, as shown in FIG. 3B, the three light emitting regions 220 in each subpixel unit 200 have an equal area, namely the first light emitting region 221, the second light emitting region 222 and the third light emitting region 226 have an equal area.

For example, as shown in FIG. 3B, the light emitting regions 220 in each subpixel unit 200 are arranged around the driving circuit 210. The embodiment includes but is not limited thereto. In a case where each subpixel unit 200 including at least three light emitting regions 220, the light emitting regions 220 are arranged around the driving circuit 210 in such a way that the each light emitting region 220 has an equal area. The embodiment includes but is not limited thereto.

Figure 4A:
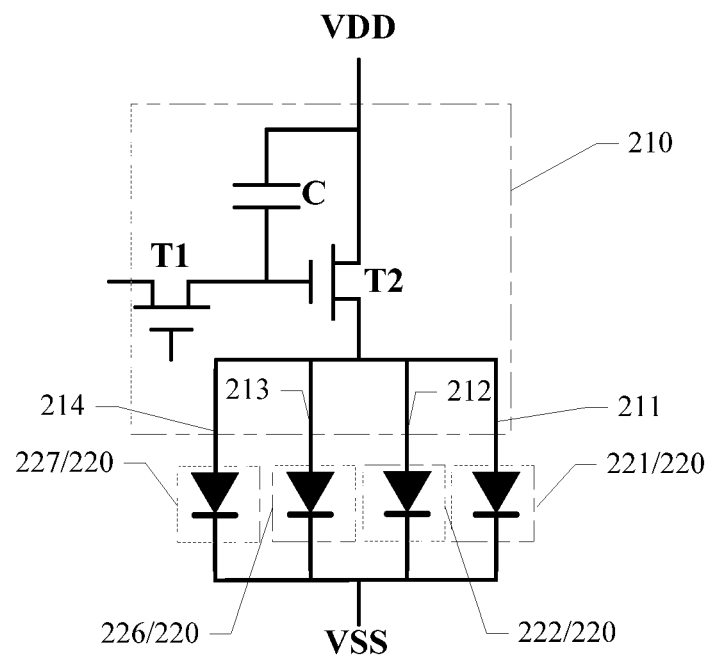
FIG. 4A is a schematic diagram of an equivalent circuit of one subpixel unit of an organic light emitting diode display panel provided by another example of one embodiment of the present disclosure.
Figure 4B:
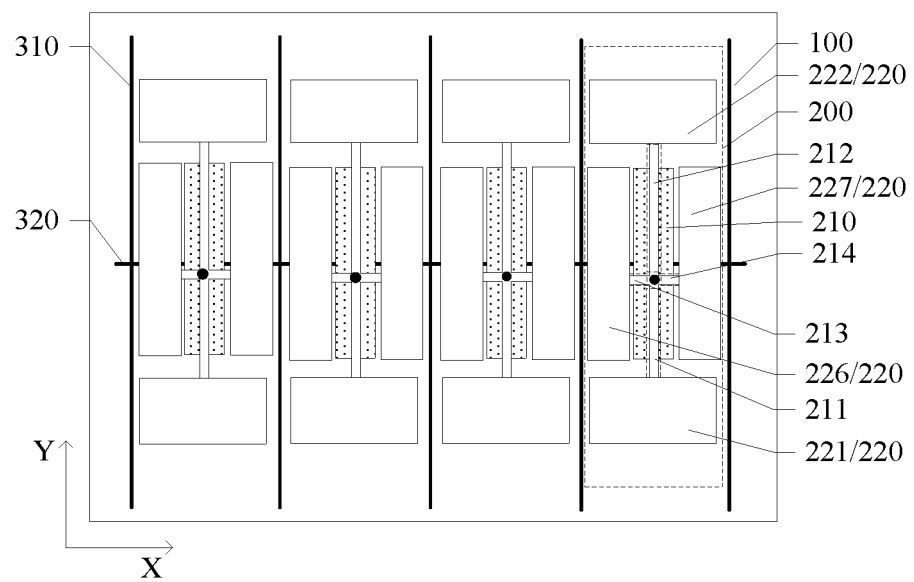
FIG. 4B is a schematic partial plan view of the organic light emitting diode display panel having the equivalent circuit as shown in FIG. 4A.

For example, FIG. 4A is a schematic diagram of an equivalent circuit of one subpixel unit in an organic light emitting diode display panel provided by another example of the embodiment, and FIG. 4B is a schematic partial plan view of the organic light emitting diode display panel having the equivalent circuit as shown in FIG. 4A. As shown in FIGS. 4A-4B, each subpixel unit 200 includes four light emitting regions 220, namely a first light emitting region 221, a second light emitting region 222, a third light emitting region 226 and a fourth light emitting region 227.

For example, the first light emitting region 221 is connected with a first sub output terminal 211 spit from the driving circuit 210; the second light emitting region 222 is connected with a second sub output terminal 212 split from the driving circuit 210; the third light emitting region 226 is connected with a third sub output terminal 213 split from the driving circuit 210; and the fourth light emitting region 227 is connected with a fourth sub output terminal 214 split from the driving circuit 210. Because a data line (or a power supply line) of the organic light emitting diode display panel transmits a display signal to the light emitting region 220 by being connected with the first electrode 223 in the light emitting region 220 through the driving circuit 210, the first light emitting region 221, the second light emitting region 222, the third light emitting region 226 and the fourth light emitting region 227 emit the same image light under the control of the same image display signal.

For example, as shown in FIG. 4B, the four light emitting regions 220 in each subpixel unit 200 have an equal area, namely the first light emitting region 221, the second light emitting region 222, the third light emitting region 226 and the fourth light emitting region 227 have an equal area.

For example, as shown in FIG. 4B, the light emitting regions 220 in each subpixel unit 200 are arranged around the driving circuit 210 in such a way that each light emitting region 220 has an equal area. The embodiment includes but is not limited thereto.

For example, the number of the light emitting regions in each subpixel unit of the organic light emitting diode display panel provided by the embodiment may also be different. The embodiment includes but is not limited thereto.

Each subpixel unit of the organic light emitting diode display panel provided by the embodiment includes at least two light emitting regions. Upon there being a defective spot in any one of the light emitting regions, after cutting off the sub output terminal connected with the abnormal light emitting unit, although the brightness density of the subpixel unit including the abnormal light emitting region is basically unchanged, the aging of the abnormal subpixel unit will be faster compared with normal subpixel units. Therefore, the more the light emitting regions are in one subpixel unit, the smaller the aging difference between maintained subpixel units and the normal subpixel units is. However, the more the light emitting regions are in one subpixel unit, the smaller the aperture opening ratio of the subpixel unit is. Therefore, the number of the light emitting regions in each subpixel unit can be determined according to the process capability and the ability of the organic light emitting diode display panel.

For example, considering the situation where the sacrificial aperture ratio is the smallest, the case that each subpixel unit includes two light emitting regions is a relatively preferred proposal.

Figure 5:
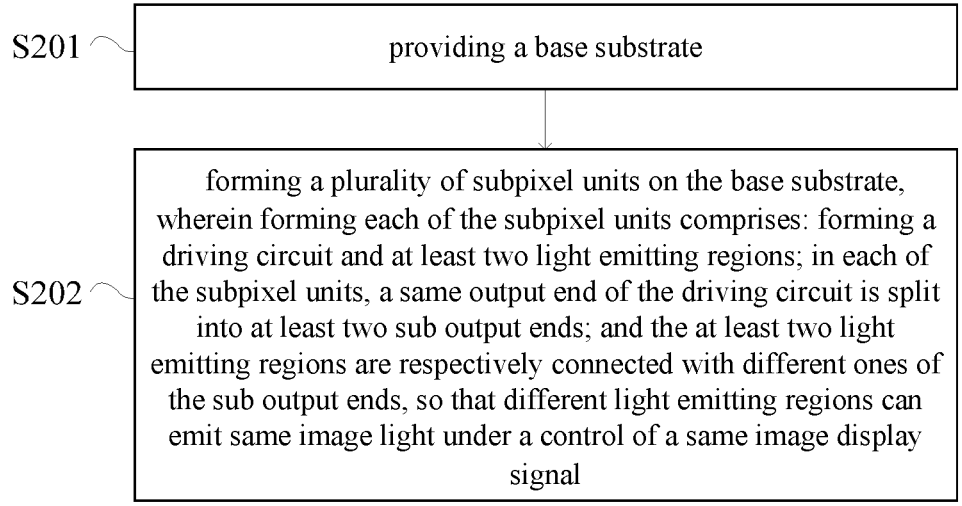
FIG. 5 is a flowchart of a manufacturing method of an organic light emitting diode display panel, provided by one embodiment of the present disclosure.

Another embodiment of the present disclosure provides a manufacturing method of an organic light emitting diode display panel. FIG. 5 is a flowchart of the manufacturing method provided by the embodiment. As illustrated in FIG. 5, the manufacturing method includes:

S201: providing a base substrate.

For example, the base substrate can be made from one or more materials selected from the group consisting of glass, polyimide, polycarbonate, polyacrylate, polyetherimide and polyethersulfone. The embodiment includes but is not limited thereto.

S202: forming a plurality of subpixel units on the base substrate, forming each of the subpixel units comprises: forming a driving circuit and at least two light emitting regions; in each of the subpixel units, a same output terminal of the driving circuit is split into at least two sub output terminals; and the at least two light emitting regions are respectively connected with different ones of the sub output terminals.

For example, TFTs and data lines and scanning lines, which are respectively configured to transmit data signals and scanning signals to the driving circuit, are formed on the base substrate.

For example, the forming of the light emitting region includes the forming of a first electrode, a light emitting layer and a second electrode; and the first electrode is connected with corresponding sub output terminal.

It should be noted that the sub output terminal connected with the light emitting region in the embodiment can be the first electrode on the outside of the light emitting region, namely a part of the first electrode in the light emitting region, disposed on the outside of the light emitting region, can be regarded as the sub output terminal connected with the first electrode of the light emitting region. The embodiment includes but is not limited thereto.

For example, the sub output terminal may be independently manufactured and configured to connect the light emitting region and the driving circuit.

For example, the driving circuit in each subpixel unit includes TFTs connected with the sub output terminal, and at least two output terminals are connected to drain electrodes of the TFTs. Therefore, the drain electrodes of the TFTs can be regarded as the output terminal of the driving circuit. The embodiment includes but is not limited thereto.

For example, the parts of the first electrodes in the light emitting regions of each subpixel unit, disposed on the outside of the light emitting regions, can be respectively connected with the drain electrodes of the TFTs. The embodiment includes but is not limited thereto.

For example, the parts of the first electrodes in the light emitting regions of each subpixel unit, disposed on the outside of the light emitting regions, can also be electrically connected at first and then connected with the drain electrodes of the TFTs.

For example, the light emitting layer can be formed by using an open mask. The light emitting layer is disposed on the organic light emitting diode display panel (as shown in FIG. 2B). But the light emitting layer in the light emitting region can only emit light by being simultaneously connected to the first electrode and the second electrode. The embodiment includes but is not limited thereto. For example, the light emitting layer may only be disposed in the light emitting region by using a fine metal mask (FMM) or an inkjet printing (IJP) technology.

For example, the second electrodes in the light emitting regions of each subpixel unit can be a common electrode layer. The embodiment includes but is not limited thereto.

For example, the first electrode can be an anode. The anode serves as a positive voltage connecting electrode of the organic light emitting diode display panel and has good conductivity and high work function value. The embodiment includes but is not limited thereto.

For example, the second electrode can be a cathode. The cathode serves as a negative voltage connecting electrode of the organic light emitting diode display panel and has good conductivity and low work function value. The embodiment includes but is not limited thereto.

For example, the forming of the light emitting region further includes the forming of a functional layer including at least one of an HTL, an ETL, an HIL, an EIL, an HBL or an EBL. The embodiment includes but is not limited thereto.

In the organic light emitting diode display panel manufactured by the manufacturing method provided by the embodiment, as the data line (or the power supply line) transmits the display signal to the light emitting region by being connected with the first electrode in the light emitting region through the driving circuit, all the light emitting regions of each subpixel unit emit the same image light under the control of the same image display signal. Because the at least two light emitting regions in the subpixel unit are in parallel connection, upon there being a defective spot in any one of the light emitting regions, after the connection between the abnormal light emitting region and the sub output terminal is cut, the current density of other normal light emitting regions in the abnormal subpixel unit including the abnormal light emitting region is increased, so the brightness is increased. Therefore, the brightness density of the entire abnormal subpixel unit is basically unchanged, so the visual brightness of the abnormal subpixel unit is basically unchanged.

For example, the at least two light emitting regions in each subpixel unit have an equal area. Therefore, in the case of normal emission of the subpixel unit, each light emitting region has same equivalent impedance and current density and synchronous aging.

For example, in a case where each subpixel unit including two light emitting regions, the light emitting regions are disposed on two opposite sides of the driving circuit in such a way that the two light emitting regions in each subpixel unit have an equal area. The embodiment includes but is not limited thereto.

For example, in a case where each subpixel unit including at least three light emitting regions, the light emitting regions in each subpixel unit are arranged around the driving circuit in such a way that all the light emitting regions in each subpixel unit have an equal area. The embodiment includes but is not limited thereto.

For example, the plurality of subpixel units include subpixel units of different colors. For example, the subpixel units of different colors may include a red subpixel unit, a green subpixel unit, a blue subpixel unit and a white subpixel unit. The embodiment includes but is not limited thereto.

For example, the driving circuit may be a 2T1C structure, namely including a first TFT, a second TFT and a storage capacitor. The embodiment includes but is not limited thereto. For example, the driving circuit may also be a 4T2C or 4T1C structure.

For example, the number of the light emitting regions in each subpixel unit of the organic light emitting diode display panel provided by the embodiment may also be different. The embodiment includes but is not limited thereto.

Each subpixel unit in the organic light emitting diode display panel provided by the embodiment includes at least two light emitting regions. Because the at least two light emitting regions in the subpixel unit are in parallel connection, upon there being a defective spot in any one of the light emitting regions, after the connection between the abnormal light emitting region and the sub output terminal is cut, although the brightness density of the subpixel unit including the abnormal light emitting region is basically unchanged, the aging of the abnormal subpixel unit will be faster compared with normal subpixel units. Therefore, the more the light emitting regions are in one subpixel unit, the smaller the aging difference between maintained subpixel units and the normal subpixel units is. However, the more the light emitting regions are in one subpixel unit, the smaller the aperture opening ratio of the subpixel unit is. Therefore, the number of the light emitting regions in each subpixel unit can be determined according to the process capability and the ability of the organic light emitting diode display panel.

Another embodiment of the present disclosure provides a display device, which includes any one of the organic light emitting diode display panels provided by the above embodiment. Upon there being a defective spot in any one of the light emitting regions of the subpixel units in the display device, the brightness of the image light, emitted by the abnormal subpixel unit including the abnormal light emitting region, is basically unchanged by cutting the connection between the abnormal light emitting region and the sub output terminal.

For example, the display device may be an organic light emitting diode display device or any product or component with display function including the display device, e.g., a TV, a digital camera, a mobile phone, a watch, a tablet PC, a notebook computer or a navigator. The embodiment is not limited thereto.

Figure 6A:
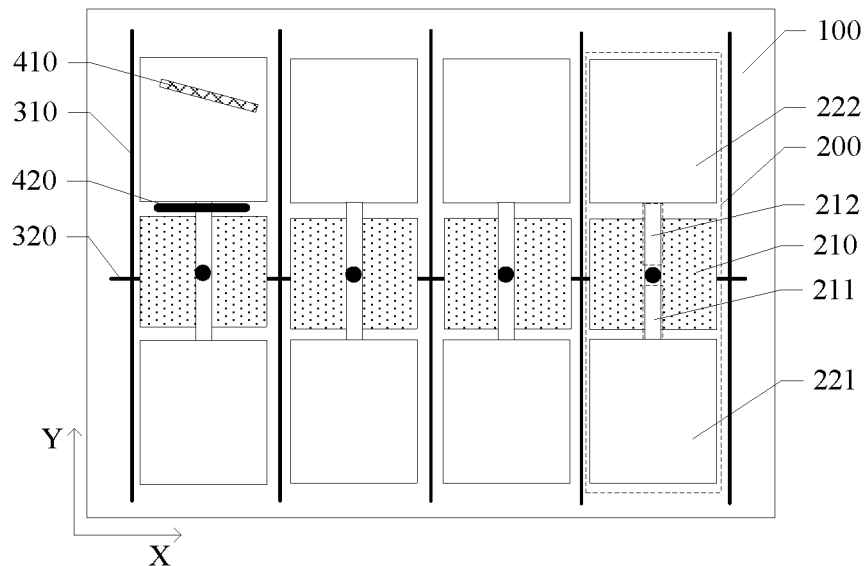
FIGS. 6A to 6C are schematic diagrams of a maintenance method of the organic light emitting diode display panel, provided by one embodiment of the present disclosure.
Figure 6B:
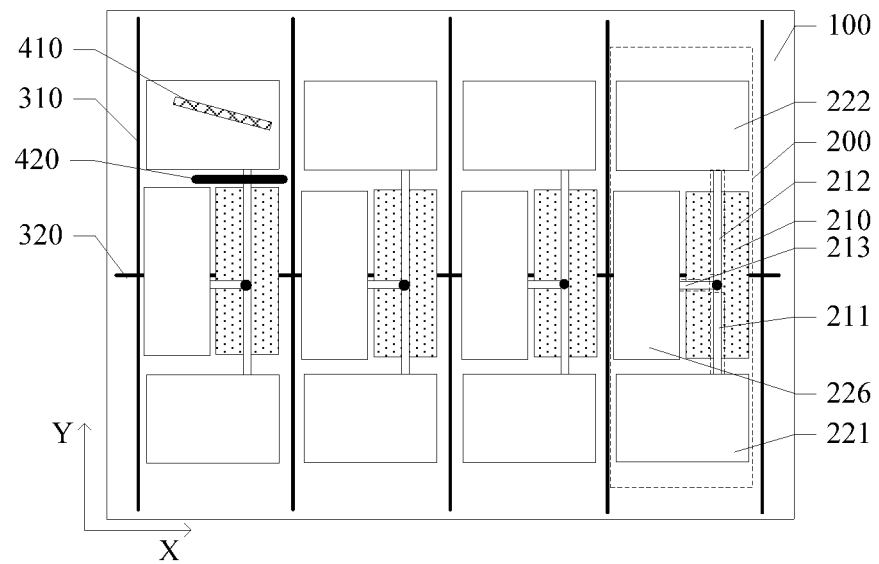
Figure 6C:
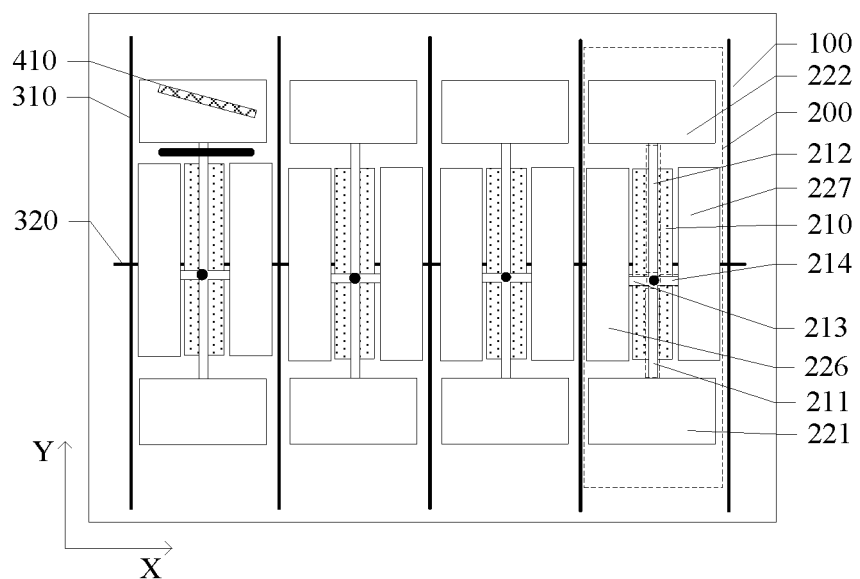

Another embodiment of the present disclosure provides a maintenance method for maintaining the organic light emitting diode display panel provided by the above embodiment. FIGS. 6A-6C are schematic diagrams of the maintenance method of the organic light emitting diode display panel, provided by the embodiment. As shown in FIGS. 6A-6C, upon there being short circuit (or other defective pixel defects) in the light emitting region 220 of the subpixel unit 200, the connection between the abnormal light emitting region 220 in the abnormal subpixel unit 200 and the sub output terminal is cut, namely the connection between the light emitting region 220 and the driving circuit 210 is cut so as to ensure that no current flows towards the cathode, thus preventing deterioration.

For example, the abnormal light emitting region and the sub output terminal are not electrically connected by the method of cutting a connecting line between the abnormal light emitting region 220 and the sub output terminal. The connecting line can be one part of the electrode of the abnormal light emitting region 220, and can also be one part of the sub output terminal. The present embodiment is not limited thereto. Because the at least two light emitting regions in the subpixel unit 200 are in parallel connection, upon there being a defective spot in any light emitting region 220, after the connection between the abnormal light emitting region 220 and the sub output terminal is cut, the current density of other normal light emitting regions in the abnormal subpixel unit 200 including the abnormal light emitting region 220 is increased, so the brightness is increased. Therefore, the brightness density of the entire abnormal subpixel unit 200 is basically unchanged, so the visual brightness of the abnormal subpixel unit 200 is basically unchanged.

For example, each light emitting region 220 includes a first electrode, a light emitting layer and a second electrode, and the first electrode is connected with corresponding sub output terminal. It should be noted that the sub output terminal connected with the light emitting region in the embodiment may be the first electrode disposed on the outside of the light emitting region, namely parts of the first electrodes in the light emitting regions, disposed on the outside of the light emitting regions, may be respectively regarded as the sub output terminals. The embodiment includes but is not limited thereto.

For example, as shown in FIGS. 6A-6C, the method of cutting the connection between the abnormal light emitting region 220 in the abnormal subpixel unit 200 and the sub output terminal includes: disconnecting the sub output terminal connected with the first electrode of the abnormal light emitting region 220. For example, the connection between the light emitting region 220 and the driving circuit 210 may be cut by cutting the part of the first electrode in the light emitting region 220, disposed on the outside of the light emitting region 220. The embodiment includes but is not limited thereto, as long as the abnormal light emitting region 220 and the sub output terminal are not electrically connected.

For example, as shown in FIGS. 6A-6C, the method of cutting the connection between the abnormal light emitting region 220 in the abnormal subpixel unit 200 and the sub output terminal includes: using a laser cutting method to cut the connection between the abnormal light emitting region 220 in the abnormal subpixel unit 200 and the sub output terminal by laser, namely a laser cutting position 420 is disposed between the light emitting region 220 and the driving circuit 210.

For example, the connection between the light emitting region 220 and the driving circuit 210 is cut by disconnecting the part of the first electrode in the abnormal light emitting region 220, disposed on the outside of the light emitting region 220, by laser cutting 420.

Upon there being a defective spot in any one of the light emitting regions, after the connection between the abnormal light emitting region and the sub output terminal is cut, the current density of other normal light emitting regions in the abnormal subpixel unit including the abnormal light emitting region is increased, so the brightness is increased. Therefore, the brightness density of the entire abnormal subpixel unit is basically unchanged, so the visual brightness of the abnormal subpixel unit is basically unchanged.

The following points should to be explained:

1) The drawings of at least one embodiment of the present disclosure only relate to the structure in the embodiment of the present disclosure, and other structures may be referenced to the usual design.

2) In the absence of conflict, the features of the same embodiment and the different embodiments can be combined with each other.

The foregoing is only the embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. An organic light emitting diode display panel, comprising:

a base substrate; and a plurality of subpixel units, located on the base substrate, wherein each of the subpixel units comprises one driving circuit and at least two light emitting regions; in each of the subpixel units, a same output terminal of the driving circuit is split into at least two sub output terminals; and the at least two light emitting regions are respectively connected with different ones of the at least two sub output terminals, the organic light emitting diode display panel further comprises a plurality of data lines and a plurality of scanning lines, the at least two light emitting regions comprise a first light emitting region, a second light emitting region, a third light emitting region, and a fourth light emitting region, the first light emitting region and the second light emitting region are respectively disposed on two opposite sides of the driving circuit, and are axisymmetric with respect to a bisector of the driving circuit extending along an extending direction of the plurality of scanning lines, the third light emitting region and the fourth light emitting region are respectively disposed on two opposite sides of the driving circuit, and are axisymmetric with respect to a bisector of the driving circuit extending along an extending direction of the plurality of data lines, the at least two light emitting regions are configured to emitting light of the same color, orthographic projections of the third light emitting region and the fourth light emitting region on the base substrate are overlapped with an orthographic projection of one of the plurality of scanning lines on the base substrate, and an orthographic projection of the first light emitting region on the base substrate and an orthographic projection of the second light emitting region on the base substrate are respectively located at two sides of the orthographic projection of the one of the plurality of scanning lines on the base substrate, each of the at least two light emitting regions comprises a first electrode, a light emitting layer and a second electrode; a portion of the first electrode of each of the at least two light emitting regions, which is located outside the light emitting region, is a corresponding one of the at least two sub output terminals, the corresponding one of the at least two sub output terminals of the first light emitting region and the corresponding one of the at least two sub output terminals of the second light emitting region are also axisymmetric with respect to the bisector of the driving circuit extending along an extending direction of the plurality of scanning lines, the corresponding one of the at least two sub output terminals of the third light emitting region and the corresponding one of the at least two sub output terminals of the fourth light emitting region are axisymmetric with respect to the bisector of the driving circuit extending along an extending direction of the plurality of data lines.

2. The organic light emitting diode display panel according to claim 1, wherein the at least two light emitting regions in each of the subpixel units have an equal area.

3. The organic light emitting diode display panel according to claim 2, wherein the at least two light emitting regions in each of the subpixel units are two light emitting regions.

4. The organic light emitting diode display panel according to claim 2, wherein the at least two light emitting regions in each of the subpixel units comprise at least three light emitting regions; and the at least three light emitting regions are arranged around the driving circuit.

5. The organic light emitting diode display panel according to claim 1, wherein the at least two light emitting regions in each of the subpixel units comprise at least three light emitting regions; and the at least three light emitting regions are arranged around the driving circuit.

6. The organic light emitting diode display panel according to claim 1, wherein each of the at least two light emitting regions comprises a first electrode, a light emitting layer and a second electrode; and the first electrode is connected with a corresponding one of the sub output terminals.

7. The organic light emitting diode display panel according to claim 1, wherein the plurality of subpixel units comprise subpixel units of different colors.

8. A display device, comprising the organic light emitting diode display panel according to claim 1.

9. A maintenance method of the organic light emitting diode display panel according to claim 1, comprising:

cutting a connection between an abnormal one of the at least two light emitting regions and a corresponding one of the sub output terminals in an abnormal one of the subpixel units.

10. The maintenance method according to claim 9, wherein cutting the connection between the abnormal one of the at least two light emitting regions and the corresponding one of the sub output terminals in the abnormal one of the subpixel units comprises: using a laser cutting method to cut the connection between the abnormal one of the at least two light emitting regions and the corresponding one of the sub output terminals in the abnormal one of the subpixel units.

11. The organic light emitting diode display panel according to claim 1, further comprising:

a pixel define layer located between the at least two light emitting regions.

12. A manufacturing method of an organic light emitting diode display panel, comprising:

providing a base substrate; and forming a plurality of subpixel units on the base substrate, wherein forming each of the subpixel units comprises:

forming one driving circuit and at least two light emitting regions; in each of the subpixel units, a same output terminal of the driving circuit is split into at least two sub output terminals; and the at least two light emitting regions are respectively connected with different ones of the sub output terminals, wherein the organic light emitting diode display panel further comprises a plurality of data lines and a plurality of scanning lines, the at least two light emitting regions comprise a first light emitting region, a second light emitting region, a third light emitting region, and a fourth light emitting region, the first light emitting region and the second light emitting region are respectively disposed on two opposite sides of the driving circuit, and are axisymmetric with respect to a bisector of the driving circuit extending along an extending direction of the plurality of scanning lines, the third light emitting region and the fourth light emitting region are respectively disposed on two opposite sides of the driving circuit, and are axisymmetric with respect to a bisector of the driving circuit extending along an extending direction of the plurality of data lines, the at least two light emitting regions are configured to emitting light of the same color, orthographic projections of the third light emitting region and the fourth light emitting region on the base substrate are overlapped with an orthographic projection of one of the plurality of scanning lines on the base substrate, and an orthographic projection of the first light emitting region on the base substrate and an orthographic projection of the second light emitting region on the base substrate are respectively located at two sides of the orthographic projection of the one of the plurality of scanning lines on the base substrate, each of the at least two light emitting regions comprises a first electrode, a light emitting layer and a second electrode; a portion of the first electrode of each of the at least two light emitting regions, which is located outside the light emitting region, is a corresponding one of the at least two sub output terminals, the corresponding one of the at least two sub output terminals of the first light emitting region and the corresponding one of the at least two sub output terminals of the second light emitting region are also axisymmetric with respect to the bisector of the driving circuit extending along an extending direction of the plurality of scanning lines, the corresponding one of the at least two sub output terminals of the third light emitting region and the corresponding one of the at least two sub output terminals of the fourth light emitting region are axisymmetric with respect to the bisector of the driving circuit extending along an extending direction of the plurality of data lines.

13. The manufacturing method of the organic light emitting diode display panel according to claim 12, wherein the at least two light emitting regions in each of the subpixel units have an equal area.

14. The manufacturing method of the organic light emitting diode display panel according to claim 12, wherein forming each of the at least two light emitting regions comprises: forming a first electrode, a light emitting layer and a second electrode; and the first electrode is connected with a corresponding one of the sub output terminals.

* * * * *